(12) United States Patent
Van Der Wiel

(10) Patent No.: US 11,049,784 B2
(45) Date of Patent: Jun. 29, 2021

(54) SEMICONDUCTOR DEVICE FOR USE IN HARSH MEDIA

(71) Applicant: Melexis Technologies NV, Tessenderlo (BE)

(72) Inventor: Appolonius Jacobus Van Der Wiel, Duisburg (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 0 days.

(21) Appl. No.: 16/438,799

(22) Filed: Jun. 12, 2019

(65) Prior Publication Data
US 2019/0385922 A1    Dec. 19, 2019

(30) Foreign Application Priority Data

Jun. 15, 2018    (EP) ..................... 18178068

(51) Int. Cl.
*H01L 23/532*    (2006.01)
*H01L 23/31*    (2006.01)
(Continued)

(52) U.S. Cl.
CPC .... *H01L 23/3171* (2013.01); *H01L 21/02271* (2013.01); *H01L 21/56* (2013.01);
(Continued)

(58) Field of Classification Search
CPC ................. H01L 21/441; H01L 21/56; H01L 21/76802; H01L 21/76832; H01L 21/76852; H01L 21/76877; H01L 21/76889; H01L 21/76895; H01L 23/291; H01L 23/5226; H01L 23/5283; H01L 23/53209; H01L 23/53261; H01L 23/53271; H01L 23/535; B81B 7/0006;
(Continued)

(56) References Cited

U.S. PATENT DOCUMENTS 4,443,930 A    4/1984 Hwang et al.
4,622,735 A    11/1986 Shibata
(Continued)

OTHER PUBLICATIONS

Smith et al. "Material and Processing Issues for the Monolithic Integration of Microelectronics with Surface-Micromachined Polysilicon Sensors and Actuators," SPIE, vol. 2639, 1995, pp. 64-73.
(Continued)

*Primary Examiner* — Stephen W Smoot
(74) *Attorney, Agent, or Firm* — Workman Nydegger

(57) ABSTRACT

A semiconductor device comprising a first and second doped semiconductor layer wherein the first layer is a monosilicon layer and the second layer is a polysilicon layer, an oxide layer covering the first and second layer, and an interconnect which electrically connects the first and second layer comprises a metal alloy which has a first part in contact with the first layer and a second part in contact with the second layer, wherein a part of the metal alloy between the first and the second part crosses over a sidewall of the second layer; at least one electronic component is formed in the first and/or second layer; the semiconductor device moreover comprises a stoichiometric passivation layer which covers the first and second layer and the oxide layer.

15 Claims, 9 Drawing Sheets

(51) Int. Cl.
  *H01L 21/02* (2006.01)
  *H01L 21/56* (2006.01)
  *H01L 23/29* (2006.01)
  *H01L 23/522* (2006.01)
  *H01L 23/528* (2006.01)
  *H01L 29/04* (2006.01)
  *H01L 29/16* (2006.01)
  *H01L 29/84* (2006.01)
  *H01L 35/22* (2006.01)
  *H01L 21/768* (2006.01)

(52) U.S. Cl.
  CPC ...... *H01L 21/76895* (2013.01); *H01L 23/291* (2013.01); *H01L 23/298* (2013.01); *H01L 23/528* (2013.01); *H01L 23/5226* (2013.01); *H01L 23/5283* (2013.01); *H01L 23/53209* (2013.01); *H01L 23/53257* (2013.01); *H01L 23/53261* (2013.01); *H01L 23/53271* (2013.01); *H01L 29/04* (2013.01); *H01L 29/16* (2013.01); *H01L 29/84* (2013.01); *H01L 35/22* (2013.01)

(58) Field of Classification Search
  CPC ..... B81B 7/0025; B81B 7/0058; B81B 7/007; B81B 2207/07
  See application file for complete search history.

(56) References Cited

U.S. PATENT DOCUMENTS

| | | | | |
|---|---|---|---|---|
| 5,541,434 | A * | 7/1996 | Nicholls | H01L 21/76838 257/383 |
| 5,798,283 | A | 8/1998 | Montague et al. | |
| 6,037,216 | A * | 3/2000 | Liu | H01L 27/10844 257/E21.646 |
| 6,403,417 | B1 * | 6/2002 | Chien | H01L 21/76895 257/E21.507 |
| 2002/0042194 | A1 * | 4/2002 | Fujimoto | H01L 21/76802 438/620 |
| 2002/0102845 | A1 * | 8/2002 | Lee | H01L 21/76895 438/677 |
| 2004/0129963 | A1 * | 7/2004 | Amo | H01L 27/0207 257/296 |
| 2007/0015360 | A1 * | 1/2007 | Lu | H01L 21/28518 438/682 |
| 2007/0164443 | A1 * | 7/2007 | Florian | H01L 21/743 257/774 |

OTHER PUBLICATIONS

Extended European Search Report for EP Application No. 18178068.5, dated Dec. 4, 2018.

* cited by examiner

DeepNwell, Pwell, Fieldoxide, polysilicon, Source/drain diffusions

*Skip poly sidewall protection*

Silicide + HDP oxide

LPCVD passivation (Noble) Bondpad metalisation

FIG. 13

SEMICONDUCTOR DEVICE FOR USE IN HARSH MEDIA

FIELD OF THE INVENTION

The present invention relates to semiconductor devices which can be deployed in harsh media. More specifically it relates to harsh media sensors comprising a passivation layer and to methods comprising such a sensor.

BACKGROUND OF THE INVENTION

FIG. 1 shows a standard connection between polysilicon 14 and mono-silicon 11 realized in a CMOS process. A well doping 10 may be present in the mono-silicon 11. Polysilicon 14 is deposited and patterned on top of a field oxide 13. The flanks of the polysilicon 14 are covered with an insulator with a side wall passivation 15 such as oxide or nitride. The mono-silicon 11 that is not covered with field oxide and the polysilicon 14 are implanted simultaneously. Then diffusion takes place to form the source and drain contacts 12. Then a metal is deposited and during an annealing step it is dissolved into the mono-silicon and the polysilicon to form a silicide 16. The metal that is not dissolved is etched away whereas the silicide 16 remains. Obtaining a first metal conductor layer 18 connected with the mono-silicon 11 and/or polysilicon 14 is achieved by deposition of a first High Density Plasma (HDP) oxide 19 followed by etching contact holes in the first HDP oxide 19 to provide access to the silicide of the poly- 14 and simultaneously other holes to provide access to the silicide of the mono-silicon 11. The contact holes are filled with a metal plug 17 and a connection between the different plugs is made with the first metal conductor 18 deposition. Patterning of this first metal 18 defines which contacts are connected and which contacts are not. Then the process of another metal layer process can be applied starting with the deposition of a second HDP oxide 20. As a result, the mono-silicon 11 is electrically connected to structures of polysilicon 14 by metal line 18 on top of metal contact plugs 17. In general copper or aluminium is used to form this first metal conductor 18.

The electrical connection between the polysilicon shield 14 and mono-silicon contact 12 shown in FIG. 1 is not suitable for pressure sensors that operate in harsh environments.

In FIG. 1 a second HDP oxide 20 is deposited over the first metal 18 and over the first HPD oxide 19 and a PECVD nitride 21 is present on top of the device.

Instead of through a first metal layer, in principle one can create a mono- 11 polysilicon 14 contact by sintering an edge 22 of polysilicon 11 that is defined on mono-silicon 14. The left of FIG. 2 shows a cross section of such a contact. During patterning of the polysilicon 14 the gate oxide 23 next to the edge of the polysilicon in the areas without field oxide is also removed. After the drain/source 12 implant and diffusion the sputtering of the metal for the silicide 16 is carried out, it then also covers the edges of the polysilicon. During the anneal step the metal diffuses into the silicon and the silicon diffuses into the metal. As a result, the silicide 16 grows at the silicon surface and therefore the silicide 16 grown on the mono-silicon 12 will connect to the silicide 16 grown at the edges of the polysilicon 14 and bridge the thin gate oxide 23, thereby making an edge contact 22. To assure that such a contact between mono- and polysilicon is not made between the gate and the source/drain diffusions of CMOS transistors a side wall passivation 15 is normally defined at the edges of the polysilicon 14 as described in U.S. Pat. No. 4,622,735. Normally no lithography is carried out for this side wall passivation 15. In this example the processing of the sidewall passivation 15 has to be skipped to make mono-polysilicon contacts or must be locally etched away when shielded piezoresistors are integrated together with CMOS transistors. The creation of mono-polysilicon contacts by creating a silicide on the edges of the polysilicon is therefore a non-standard way of CMOS processing. Sputtering at side walls is normally not required for CMOS processing and therefore special control is needed to assure mechanical and electrical connection at the edges of the polysilicon. Standard CMOS processes might need modifications to assure proper mono-polysilicon contacts. Dedicated Process Control Modules must be developed to monitor the quality of the mono-polysilicon contact during mass production.

If it is not possible to use aluminum of copper interconnects, alternative prior art solutions lead to an increase of the resistance of the connection lines. This is illustrated in the table below shows the resistance of different kinds of interconnect. A top metal layer of 1 μm aluminium is very common for CMOS processing (e.g. metal 18 in FIG. 1) and can be used as a bench mark for resistivity. The table shows that sheet resistance of doped silicon with a silicide has a sheet resistivity that is two orders of magnitude higher than that of aluminium:

| | | |
|---|---|---|
| $R_{sheet}$ 1 μm Al | 0.03 | Ohm/sq |
| $R_{sheet}$ 0.2 μm Pt | 0.85 | Ohm/sq |
| $R_{sheet}$ silicided silicon | 3.0 | Ohm/sq |

For harsh media often a 0.2 um thick platinum layer is used with the compromise between thickness (cost) and resistivity resulting in a resistivity that is more than an order of magnitude higher than that of 1 μm aluminium. In view of this combination of a good conductivity of the interconnects and a reliable operation in harsh media, there is therefore still room for improvement in semiconductor devices which need to be robust against harsh media and in methods for producing these semiconductor devices.

SUMMARY OF THE INVENTION

It is an object of embodiments of the present invention to provide a semiconductor device which provides reliability in harsh media and to provide a method for producing such a semiconductor device.

The above objective is accomplished by a method and device according to the present invention.

In a first aspect embodiments of the present invention relate to a semiconductor device.

The semiconductor device comprises a first doped semiconductor layer, a second doped semiconductor layer, an oxide layer covering the first doped semiconductor layer and the second doped semiconductor layer. The first doped semiconductor layer is a monosilicon layer and the second doped semiconductor layer is a polysilicon layer The semiconductor device also comprises at least one interconnect. The interconnect is electrically connecting the first doped semiconductor layer with the second doped semiconductor layer. The interconnect comprises a metal alloy which has a first part in contact with the first doped semiconductor layer and a second part in contact with the second doped semiconductor layer. A part of the metal alloy between the first part and the second part crosses over a sidewall of the second doped semiconductor layer.

In embodiments of the present invention the semiconductor device may also comprise a conductive path which comprises polycrystalline semiconductor material. This may be structured polycrystalline material with slits in the direction of the current.

At least one electronic component is formed in the first and/or second semiconductor layer.

The semiconductor device moreover comprising a stoichiometric passivation layer which covers the first and second doped semiconductor layer and the oxide layer.

It is an advantage of embodiments of the present invention that the stoichiometric passivation layer provides reliability of the semiconductor device (e.g. sensor) in harsh media.

It is an advantage of embodiments of the present invention that such a stoichiometric passivation layer can be applied without damaging the interconnect and/or the conductive path. This is possible because the metal alloy and the structured polycrystalline semiconductor material do not get damaged by the heat when applying the stoichiometric passivation layer.

It is an advantage of embodiments of the present invention that the chemical and mechanical robustness is increased by providing a passivation which has a stoichiometric structure.

It is an advantage of embodiments of the present invention that all conductive paths are present under the passivation layer as this allows to avoid leakage currents between the connection paths, especially when the semiconductor device is exposed to moisture.

It is an advantage that a semiconductor device in accordance with embodiments of the present invention can be produced using standard CMOS production facilities.

In embodiments of the present invention the bondpad is made of a noble metal.

In embodiments of the present invention the sidewall of the second doped semiconductor layer is perpendicular to the surface of the first and second doped semiconductor layers. This is achieved by vertical etching. Perpendicular sidewalls to the first and second semiconductor layers is particularly advantageous as it has the advantage that smaller transistors can be realized. The interconnect comprises a metal alloy on the sidewall of the second doped semiconductor layer in addition to the metal alloy on the planar structures for making the connection between the first and second semiconductor layer.

In embodiments of the present invention the semiconductor device comprises a well of a second conductivity type in a deep well of a first conductivity type or substrate of the first conductivity type opposite to the second conductivity type.

The deep well or substrate of the first conductivity type are realized in the first doped semiconductor layer.

The at least one the electronic component is present in the well of the second conductivity type.

The second semiconductor layer is present between the passivation layer and the electronic component. The oxide layer is present over the second semiconductor layer, over the well and over the deep well or substrate of the first conductivity type.

In embodiments of the present invention the conductive path is connected between the at least one electronic component and at least one via which is connected through the passivation layer with a bondpad.

It is an advantage of embodiments of the present invention that, by providing a conductive path between the at least one via and the electronic component, it is possible to put the via and the electronic component at a certain distance from each other.

In embodiments of the present invention the semiconductor device comprises a field oxide wherein the field oxide is present between the second doped semiconductor layer and the first doped semiconductor layer.

If a well is present in the first doped semiconductor layer, the field oxide may be present between the second doped semiconductor layer and the well.

In embodiments of the present invention the field oxide provides a spacer between the electronic components and the second doped semiconductor layer. The second doped semiconductor layer serves as an electric shield and prevents the second doped semiconductor layer from modulating the lowly doped region under the shield. In embodiments of the present invention the areas under the field oxide have a lower doping than the areas where no field oxide is grown. In embodiments of the present invention these low doped areas are used as electronic component (e.g. piezo resistor). It is an advantage of embodiments of the present invention that the electrical insulation between the well and the second doped semiconductor layer is provided by the field oxide.

In embodiments of the present invention the passivation layer comprises $Si_3N_4$ or diamond like carbon or diamond or SiC.

In embodiments of the present invention the second doped semiconductor layer is at least partially covered with a metal alloy.

This second doped semiconductor layer may for example be a polysilicon layer (e.g. to obtain a polysilicon shield). The metal alloy may be a silicide. To avoid CTE mismatch it is better not to have silicide above the electronic component (e.g. sensing element). Therefore, the silicide is sometimes only partially covering the second doped semiconductor layer. The advantage of the silicide is that it may result in an improved contact (lower resistivity) between the second and the first doped semiconductor layer.

In embodiments of the present invention the at least one electronic component is a piezo resistor. These semiconductor devices may be configured such that they can be used as a pressure sensor.

In embodiments of the present invention the conductive paths comprise a highly doped path of the second conductivity type in the well of the second conductivity type.

In embodiments of the present invention the conductive path comprises a patterned polysilicon layer between the electronic component and the at least one via.

It is an advantage of embodiments of the present invention that the conductivity is increased by patterning the polysilicon layer. In embodiments of the present invention patterning results in an increased surface of the polysilicon structures perpendicular to the direction of the current. In embodiments of the present invention wherein the polysilicon structure is covered with silicide this results in an increased amount of silicide in the direction of the current and therefore the line conductivity can be at least two times higher than for a flat polysilicon structure.

In embodiments of the present invention the conductive path comprises structured polycrystalline semiconductor material partially turned into a metal alloy. Thereby metal is diffused in the polycrystalline material such that the remaining part is covered with a metal alloy.

It is an advantage of embodiments of the present invention that the conductivity of the conductive path is increased even more by providing the metal alloy over it. This metal alloy may for example be a silicide.

In certain embodiments of the present invention the conductive path comprises at least one metal filled slit parallel to a direction of a current when the current is flowing in the conductive path. In some embodiments of the present invention the interconnect comprises a metal filled slit in contact with the metal alloy.

In embodiments of the present invention the interconnect is electrically connected with the first doped semiconductor layer through a highly doped contact.

In embodiments of the present invention where the first doped semiconductor layer is a deep well of the first conductivity type, the highly doped contact may also be of the first conductivity type.

In a second aspect embodiments of the present invention relate to a method for manufacturing a semiconductor device.

The method comprises:
providing a first doped semiconductor layer,
providing a second doped semiconductor layer,
wherein the first and second doped semiconductor layer are provided such that at least one electronic component is formed in the first and/or second semiconductor layer and wherein the first doped semiconductor layer is a monosilicon layer and wherein the second doped semiconductor layer is a polysilicon layer.

In embodiments of the present invention the method may comprise providing an interconnect which comprises a metal alloy which has a first part in contact with the first doped semiconductor layer and a second part in contact with the second doped semiconductor layer such that a part of the metal alloy between the first part and the second part crosses over a sidewall of the second doped semiconductor layer. In embodiments of the present invention the metal alloy extends from the first part to the second part and provides the electrical interconnection between the first doped semiconductor layer and the second doped semiconductor layer.

In embodiments of the present invention the method may comprise providing a conductive path which comprises structured polycrystalline semiconductor material, The method moreover comprises depositing an oxide layer over the second doped semiconductor layer and over the first doped semiconductor layer and providing a stoichiometric passivation layer over the first and second doped semiconductor layer and over the oxide layer.

It is an advantage of embodiments of the present invention that the contact between the first doped semiconductor layer (e.g. the deep well) and the second doped semiconductor layer (e.g. the polysilicon shield) comprises a metal alloy (e.g. silicide). It is an advantage of embodiments of the present invention that the conductive path comprises structured polycrystalline semiconductor material (e.g. structured polysilicon connections) as this allows to apply the passivation layer at high temperature to obtain a stoichiometric passivation layer. By increasing the temperature a crystalline passivation layer can be grown without dislocations or voids. Crystalline structures have the advantage that they etch slower and therefore are more robust against harsh environments than amorphous material with the same combination of atoms. In embodiments of the present invention the passivation layer is applied using low pressure chemical vapor deposition.

In embodiments of the present invention the first doped semiconductor layer is a deep well of a first conductivity type or a substrate of the first conductivity type. An electronic component may be present in a well in the deep well or in the substrate.

In embodiments of the present invention the second doped semiconductor layer is provided without sidewall protection at its edges. The second doped semiconductor layer may for example be a polysilicon shield. This shield may be provided over the electronic component without sidewall protection at its edges. A silicide is then formed between the edges of the polysilicon shield and the substrate in areas where no field oxide is present at the edge of the polysilicon.

In embodiments of the present invention the at least one conductive path is provided starting from the at least one electronic component, and the at least one via is provided through the passivation layer such that the via is connected with the conductive path and with a bondpad on the via.

In embodiments of the present invention the provided conductive path comprises a polycrystalline semiconductor material covered with a metal alloy.

In embodiments of the present invention the conductive path is a doped conductive path of the second type and forms a diode with the deep well of the first type. In that case capacitance and leakage currents are proportional to the surface of the conductive path. A compromise can be made between leakage currents and capacitance by defining the conductive path on top of the field oxide.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIGS. 12 to 13 show method steps of a method in accordance with embodiments of the present invention.

Figure 1:
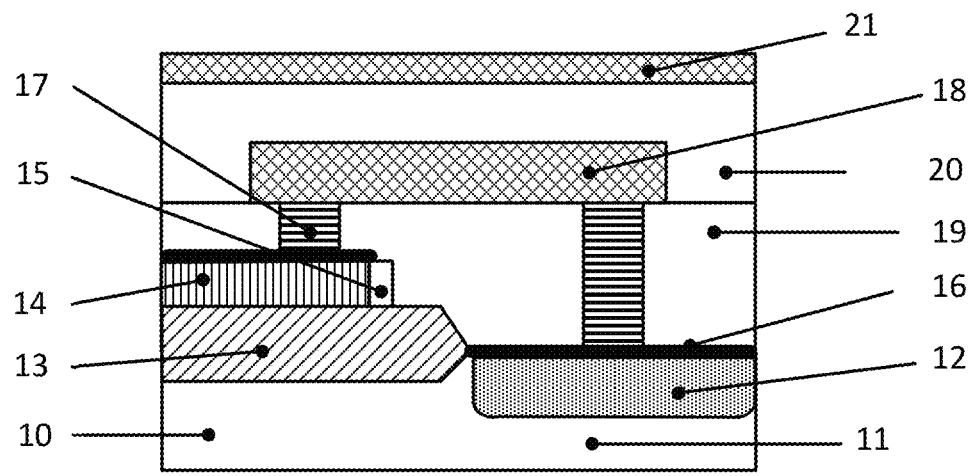
FIG. 1 shows a standard connection between polysilicon and mono-silicon realized in a CMOS process.
Figure 2:
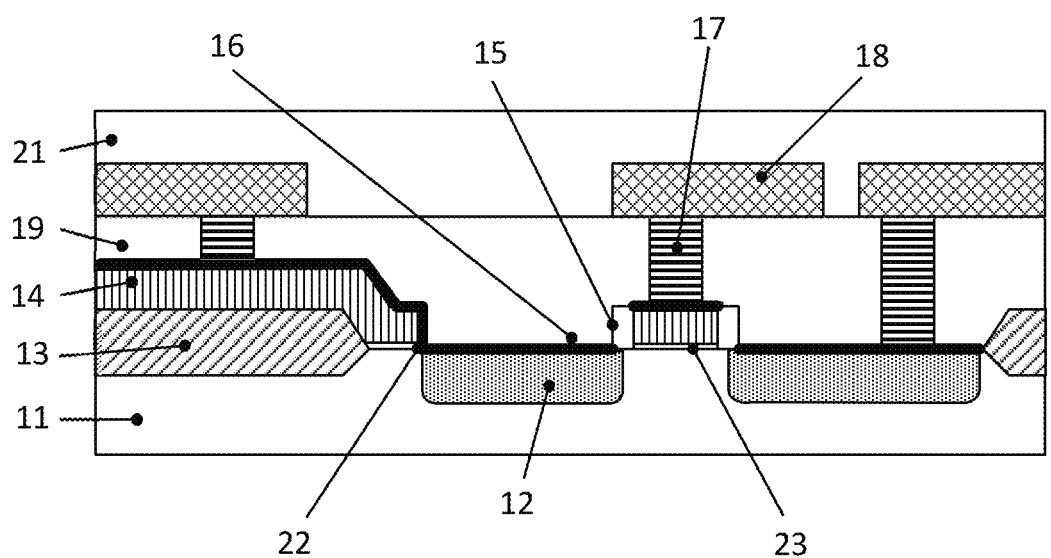
FIG. 2 shows a prior art silicide contact between polysilicon and monosilicon.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In a first aspect embodiments of the present invention relate to a semiconductor device 100 which comprises a first doped semiconductor layer 112, a second doped semiconductor layer 122, an oxide layer 127 covering the first doped semiconductor layer 112 and the second doped semiconductor layer 122, and comprising an interconnect. Semiconductor devices according to embodiments of the present invention may also comprise a conductive path.

In embodiments of the present invention the first doped semiconductor layer 112 may be electrically connected with the second doped semiconductor layer 122 by means of the interconnect which comprises a metal alloy 124. The metal alloy has a first part in contact with the first doped semiconductor layer and a second part in contact with the second doped semiconductor layer. A part of the interconnect between the first part and the second part crosses over a sidewall 133 of the second doped semiconductor layer 122. The metal alloy (e.g. silicide) thereby electrically interconnects the first doped semiconductor layer and the second doped semiconductor layer.

In embodiments of the present invention the conductive path may comprise polycrystalline material. This may be structured polycrystalline material with slits in the direction of the current (e.g. structured polysilicon connections).

In embodiments of the present invention at least one electronic component 115 is formed in the first and/or second semiconductor layer 112, 122.

The semiconductor device moreover comprises a stoichiometric passivation layer 128 which covers the first and second doped semiconductor layer 112, 122 and the oxide layer 127.

In embodiments of the present invention the second doped semiconductor layer 122 is partially covering the first doped semiconductor layer 112.

In embodiments of the present invention the first semiconductor layer and the second semiconductor layer may be silicon layers. The first or second semiconductor layer can for example be a poly- or a mono-silicon layer.

In embodiments of the present invention the semiconductor device 100 comprises a well 114 of a second conductivity type (e.g. p-type) in a deep well or substrate 112 of a first conductivity type (e.g. n-type) opposite to the second conductivity type. The deep well or the substrate of the first conductivity type are thereby realized in the first doped semiconductor layer. Reference is made to a deep well 112 to make the distinction between the well 114 and the deep well 112 which is deeper than the well 114.

In this example at least one electronic component 115 in the well 114, and the second doped semiconductor layer 122

(this may for example be a polysilicon shield 122) is present between the passivation layer 128 and the electronic component 115.

In this example the oxide layer 127 is present over the second semiconductor layer 122, over the well 114, over the deep well 112 of the first conductivity type or substrate of the first conductivity type. The deep well 112 of the first conductivity type or the substrate of the first conductivity type are thereby realized in the first doped semiconductor layer 112. The deep well 112 may for example be a doped mono-silicon layer.

For CMOS circuits an n-type deep well 112 is created in a p-substrate 110 to have electrical isolation between different deep n-wells 112 which avoids cross-talk between sub-circuits. One can leave out deep n-wells 112, but then one must use n-type substrates 110 instead of p-type substrates and then the bulk of the device has to be connected to the highest voltage. Normally the bulk of CMOS is p-type and electrically connected to ground. Discrete pressure sensors without CMOS circuitry normally are made of n-type substrates.

The interconnect which comprises the metal alloy 124 and which is interconnecting the first and second doped semiconductor layers (e.g. mono- and polysilicon) is covered with the passivation layer 128 which provides reliability in harsh media. The passivation layer is a stoichiometric passivation layer comprising materials such as $Si_3N_4$, DLC, diamond or SiC to achieve maximum chemical and mechanical robustness. The stoichiometric passivation layer is formed at temperatures higher than 600 or even 800° C. and therefore is not compatible with metals such as platinum, aluminium and copper which are normally used for standard CMOS processing. At such temperatures aluminium melts and copper diffuses to the silicon and destroys the semiconductor properties of the silicon. Furthermore, in case of a copper metal conductor 18 the construction shown in FIG. 1 would crack due to the high thermal expansion and high stiffness of the copper.

In embodiments of the present invention, on the other hand, a stoichiometric passivation layer can be applied because the interconnect between the poly- and the mono-silicon comprises a metal alloy 124 (e.g. silicide) and the conductive path comprises structured polycrystalline semiconductor material. The interconnect and the conductive path are both made of materials which are resistant against high temperatures.

In embodiments of the present invention the second doped semiconductor layer may be a polysilicon layer and the first doped semiconductor layer may be a monosilicon layer. It is advantageous that the ohmic contact between the polysilicon and the monosilicon is not achieved by simply growing the polysilicon on top of monosilicon with standard techniques such as LPCVD used for CMOS processing as this would result in oxidation of the monosilicon during the loading of the wafers with exposed monosilicon into the deposition tool.

In embodiments of the present invention the first conductivity type is n-type and the second conductivity type is p-type. In embodiments of the present invention the at least one electronic component is a piezo-resistor.

In embodiments of the present invention the polysilicon shield 122 above the electronic component 115 comprises a dopant of the first conductivity type.

Figure 3:
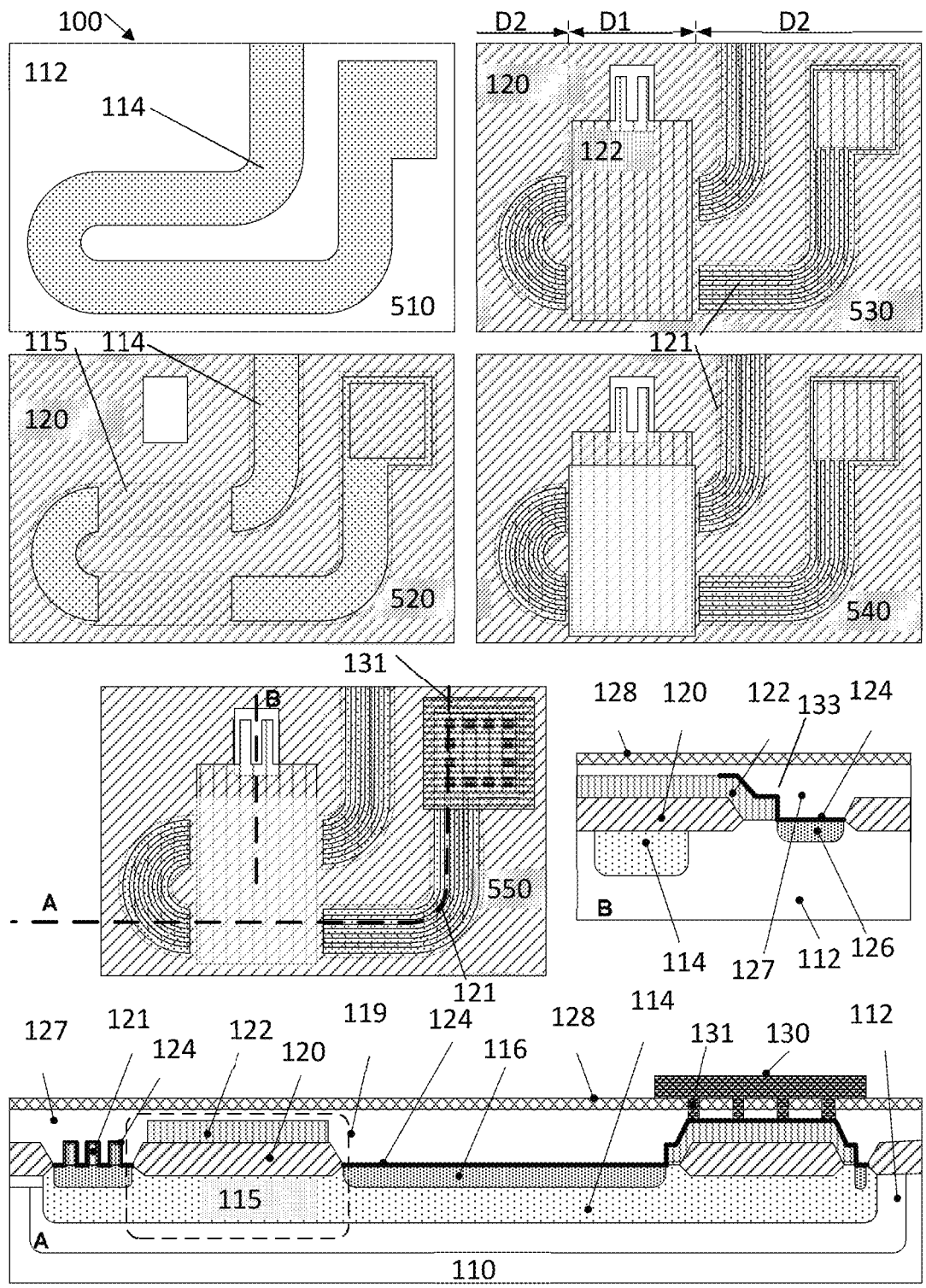
FIG. 3 shows a schematic drawing of a semiconductor device comprising an interconnect and a conductive path in accordance with embodiments of the present invention.

FIG. 3 shows an exemplary implementation of a conductive path 121 connected between the at least one electronic component 115 and at least one via 131 through the passivation layer 128 which is connected with a bondpad 130.

In this example area 510 shows the layout of a well 114 of the second conductivity type on a deep well 112 of the first conductivity type.

Area 520 shows the areas where a field oxide 120 is grown. It covers two rectangles each indicating an electronic component 115 (e.g. piezo resistors) at the bottom left of the area.

Area 530 shows where polysilicon 122 is present as shield and where polysilicon 121 is present to enhance the conductivity in the paths defined by field oxide 120. The shield 122 and its contact to the substrate (region D1) are of the first conductivity type (e.g. n-doped) whereas the bondpads and the conductive paths (regions D2) are of the second conductivity type (e.g. p-doped).

Area 540 shows the conductive paths 121 for the electronic components 115 (e.g. piezoresistors). In this example no silicide is present on the shield above the piezo resistors.

Area 550 shows the contact holes 131 in the passivation layer 128 above the polysilicon in the bondpad area on the top right where the dark square indicates the bondpad metal.

Cross section A shows from left to right a conductive path 121 with polysilicon lines (structured polysilicon connections) covered with silicide 124, an electronic component 115 (e.g. piezo-resistor) defined by a diffusion of the second conductivity type and isolated from the polysilicon shield 122 with the field oxide 120, a conductive path 121 comprising polysilicon lines covered with silicide between the electronic component 115 and the bondpad 130 where the depth of the vias through the passivation layer are minimised by the presence of the field oxide and the polysilicon.

Cross section B shows from left to right an electronic component defined by a diffusion of the second conductivity type 114 and isolated from a polysilicon shield 122 with the field oxide 120 and the connection to the bulk 112 with doping of the first conductivity type and a silicide 124 of the interconnect between the first doped semiconductor layer 112 and the second doped semiconductor layer 122. The polysilicon shield 122 does not have a silicide above the electronic components to assure optimal matching of expansion coefficients.

Figure 4:
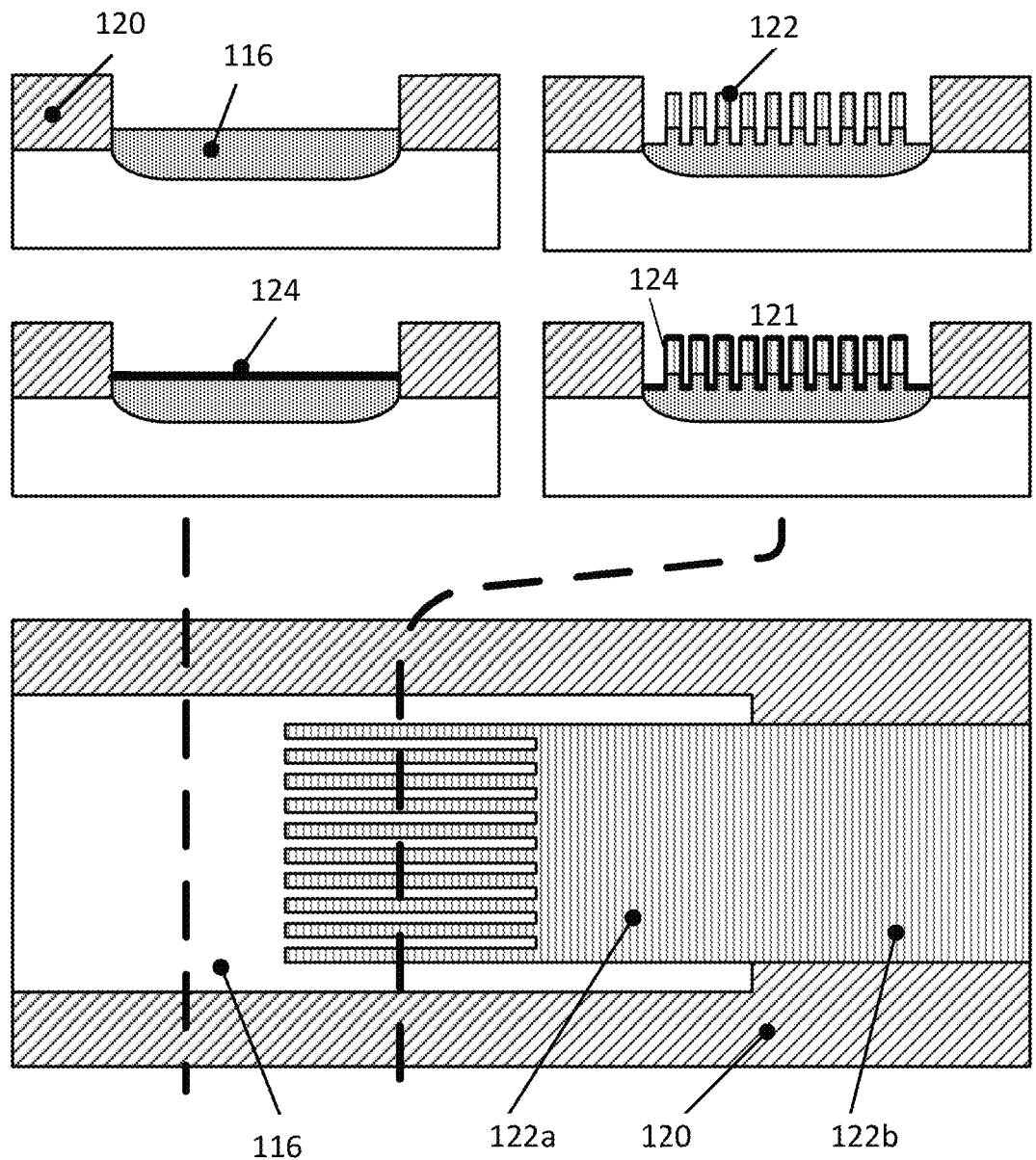
FIG. 4 shows possible implementations of a conductive path in accordance with embodiments of the present invention.

FIG. 4 shows a possible implementation of a conductive path 121 in accordance with embodiments of the present invention. In this example lanes are defined by absence of field oxide 120 and an implant and silicide 124 are provided on the mono-silicon 116 between the areas of field oxide 120. This is shown at the left of the top view in FIG. 4. The cross section shows that here the conductivity of the source/drain diffusion is enhanced by the silicide process which will result in a flat surface. The sheet resistivity of such a surface is about 3 ohm/square, 100 times higher than the sheet resistance of a 1 μm thick aluminium layer.

In a preferred embodiment the conductive path 121 comprises thin lines of polysilicon 122 (polysilicon structures) that are aligned with the direction of the current. The $2^{nd}$ cross section shows that in this way a lot of silicon surface is created perpendicular to the direction of the current. As a result more silicide 124 is available in the direction of the current and therefore the line conductivity can be at least two times higher than for the option at the right.

At the bottom of FIG. 4 a conductive path is shown which comprises at the far right a conductive line that consists of a polysilicon line 122b on top of the field oxide 120 that is doped and covered with silicide 124. This configuration has the advantage that electrical insulation to the substrate is provided by the field oxide and not by a pn junction. This will considerably reduce leakage currents of the device.

Also, here polysilicon lines could be used, but then no conduction is present between the lines of polysilicon.

Right from the middle a less interesting option is indicated where non-patterned polysilicon 122a provides conduction in an area where the field oxide 120 is removed. With the same diffusion and silicide 124, polysilicon will always have a higher sheet resistance than mono-silicon.

Figure 5:
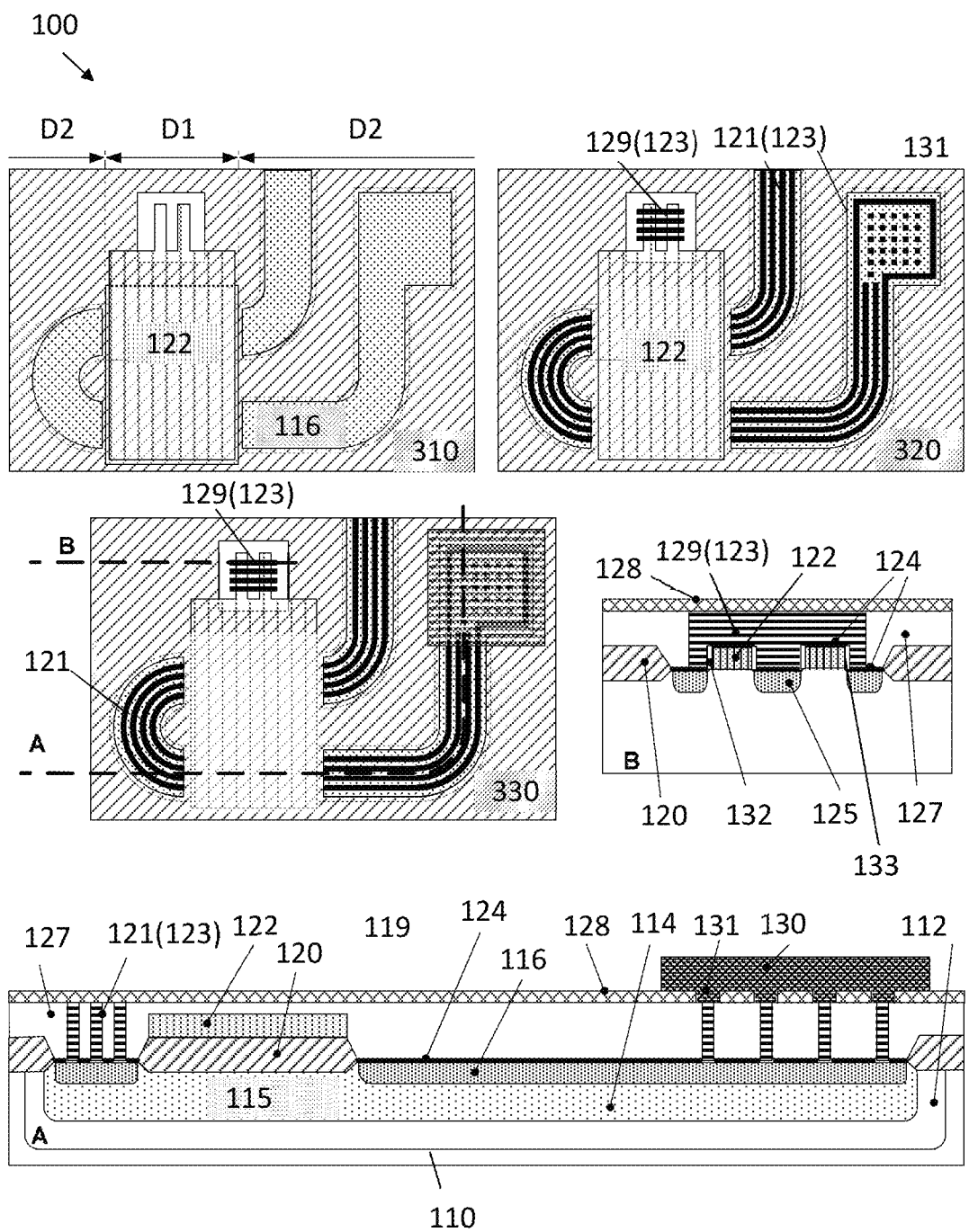
FIG. 5 shows layout features of a semiconductor device in accordance with an exemplary embodiment of the present invention.

FIG. 5 shows layout features of a semiconductor device in accordance with an exemplary embodiment of the present invention.

In this figure the second doped semiconductor layer 122 partially overlaps the first doped semiconductor layer 112. A first part of the interconnect 129 is in contact with the first doped semiconductor layer 112. A second part of the interconnect is in contact with the second doped semiconductor layer 122. A part of the interconnect between the first side and the second side crosses a sidewall 133 of the second doped semiconductor layer. The interconnect may have a plurality (e.g. alternating) of contacts with the first semiconductor layer and the second semiconductor layer. A sidewall passivation 132 may be present on the sidewall 133.

The top left schematic drawing 310 shows an intermediate process stack wherein the polysilicon shield 122 and a contact well 116 are shown. In this stack no silicide is present on the polysilicon shield 122 above the electronic components. In embodiments of the present invention the polysilicon shield may be doped to assure enough conductivity for shielding the electronic components. Not adding the silicide to the polysilicon shield may be advantageous because silicide might introduce a CTE (coefficient of thermal expansion) mismatch between the polysilicon shield and the areas of the electronic components beneath. In embodiments of the present invention silicide is present on the contact area (e.g. on the poly-silicon where contact is made to the metal slit) for a proper electrical contact to the substrate.

The schematic drawing 320 shows the interconnects 129 which are comprising metal filled slits 123 that provide the substrate contact for the polysilicon shield. The schematic drawing also shows the conductive paths 121 for the electronic components 115 (e.g. piezoresistors). In this example the conductive paths 121 are comprising metal filled slits 123.

The length of the slit is so long that a metal which fills the slit is in contact with the second doped semiconductor layer 122 and with the first doped semiconductor layer 112 and this even if a side wall passivation is present at the edge of the polysilicon.

The metal in the metal filled slit can for example comprise Tungsten. This allows to apply a passivation layer without damaging the interconnection in contrast to for example copper or aluminum interconnects.

The metal filled slits disclosed in these paragraphs may be combined with interconnects and conductive paths according to embodiments of the present invention. Essential for the present invention is that the interconnect also comprises a metal alloy. In embodiments with a conductive path the conductive path may comprise a structured polysilicon connection.

The schematic drawing 330 shows the bondpad area on the top right where the dark square indicates the bondpad metal 130 on top of a stoichiometric passivation layer 128. Holes etched in this passivation layer (not shown) provide the electrical connection from the noble top metal to the metal filled slits under this passivation layer.

Cross section A shows from left to right a conductive path 121 with metal filled slits 123 on a substrate contact 116 of the second conductivity type (e.g. p-type source/drain diffusion), an electronic component 115 (e.g. piezo-resistor) defined by a well diffusion 114 of the second conductivity type and isolated from the polysilicon shield 122 with the field oxide 120 (the polysilicon shield 122, the field oxide 120 and the electronic component are together forming a shielded electronic component). Further to the right a conductive path 121 (comprising the silicide 124) between the electronic component 115 and the bondpad 130 is shown. For the bondpad a noble top metal 130 is deposited on top of the stoichiometric passivation 128 and connected to the metal filled slits 123 through vias 131 in that passivation. Preferably the vias are made under the bondpad away from the electronic component.

Cross section B shows the cross section of an interconnect comprising a metal filled slit 123 that is placed perpendicularly across an array of polysilicon structures 122 and providing an electrical contact between the mono- 112 and polysilicon 122 although the polysilicon side walls are isolated by a polysilicon sidewall passivation 132. The polysilicon structures 122 as well as the deep well 112 comprise dopants of the first conductivity type. The metal filled slit 123 connects deep well contacts 125, which are doped with a dopant of the first conductivity type (e.g. n++ contacts), with the polysilicon shield 122.

The field oxide 120 may for example have a thickness of 450+/−200 nm. The polysilicon 122 may for example have a thickness of 400 nm+/−150 nm and the HDP oxide 127 may for example have a thickness of 800 nm+/−400 nm.

It is an advantage of embodiments of the present invention that electronic components (e.g. a piezoresistor) can be created which are connected to the substrate and interconnect under a stoichiometric passivation layer. Thus, a semiconductor device can be created which is protected against a harsh environment. It is an advantage of embodiments of the present invention that the interconnect has a resistance which is not significantly higher than that of a conventional interconnect. The semiconductor device may for example be a sensor. An increase in the resistance of the interconnect will result in a reduction of the sensitivity of the sensor.

In embodiments of the present invention highly conductive paths 121 connect the at least one electronic component 115 with at least one bondpad 130 on top of the passivation. This connection between a conductive path 121 and a bondpad may be achieved by means of a via through the passivation layer 128. In embodiments of the present invention the bondpads are made of noble metal.

It is an advantage of embodiments of the present invention that such a stack can be realized using a process flow which comprises standard CMOS processing steps. Therefore, most of this flow can be executed in any CMOS wafer-fab up to deposition of the passivation layer when a stoichiometric passivation layer is applied.

Standard CMOS provides (low) doped areas 115 under a field oxide 120 and (higher) doped areas 116 where no field oxide is grown. The surface of these latter areas can be turned into a metal alloy (e.g. silicide) 124. In embodiments of the present invention the (low) doped areas 115 under the field oxide 120 are used as electrical component 115 (e.g. piezo resistor).

In embodiments of the present invention the second conductivity type is p-type. The p-well areas 115 or piezoresistors can be electrically isolated from each other by using an n-type wafer. However, CMOS is normally realized in p-type silicon. Therefore prior to the p-wells a so called deep n-well diffusion may be defined to provide the electrical isolation between the piezo-resistors 115. One could define this diffusion for the entire wafer without using photolithography of the implantation. In embodiments of the preset invention the well 114 is a highly doped silicon well with silicide and is used as conductive path 121 between the at least one electronic component 115 and the vias 131. In CMOS this diffusion 116 is in general referred to as the source/drain areas.

It is an advantage of embodiments of the present invention that the polysilicon shields 122 can be made using the same process as the gates of CMOS transistors.

In embodiments of the present invention the field oxide 120 provides a spacer between the electronic component 115 and the and the polysilicon shield. This spacer prevents the shields from modulating the lowly doped region under the shield.

In embodiments of the present invention contacts holes 131 are etched in the passivation layer 128 so that bondpads 130 on top of the passivation layer 128 connect to the conductive path 121 under the passivation layer 128. Preferably the bondpads 130 are realized with a noble metal so that only the passivation layer 128 and the noble metal bondpads are exposed to the media above the sensor.

Applying the passivation layer and the noble metal may be done using dedicated equipment in a dedicated clean room to avoid contamination with CMOS.

Figure 6:
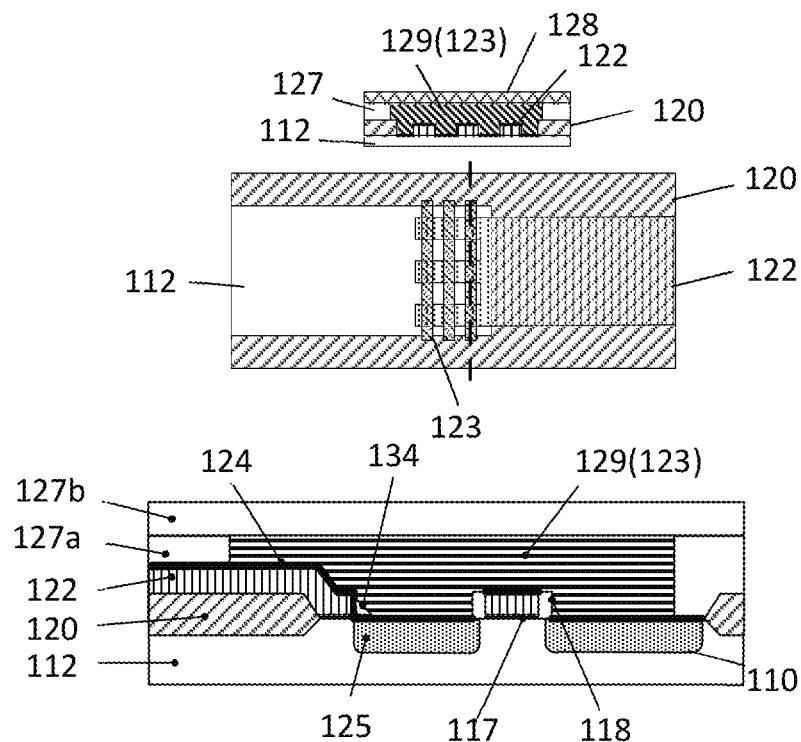
FIG. 6 schematically shows an exemplary embodiment of the present invention illustrating an implementation of the mono-polysilicon contacts.

FIG. 6 schematically shows an exemplary embodiment of the present invention illustrating an implementation of the mono 112—polysilicon 122 contacts which can be used in combination with interconnects which comprise silicide in accordance with embodiments of the present invention. In FIG. 6 the interconnect comprises a metal filled slit 123. The dimensions of the slit are such that the polysilicon shield 122 and the substrate 112 contact are interconnected using a metal plug.

The width of the slit is for example between 0.8 and 1.2 or even between 0.5 and 3 times the critical dimension (the critical dimension is the diameter of a CMOS contact plug). In embodiments of the present invention the width of the slit is about twice the thickness of the sputtered metal. The metal is not only deposited on the bottom of the slit, but also on the side walls. When the slit is too deep the deposition at the sides of the slit will close off the slit at the top before the bottom of the slit is filled. When the slit is too wide the slit will not be filled when the thickness of the metal is less than the depth of the slit. So, the width of the slit is optimized for a certain technology as function of depth of the slit and thickness of the sputtered layer. In embodiments of the present invention the depth of the slit may be larger than the width. The depth and the width are preferable selected such that the slit is filled with metal without a void at the bottom or a dip at the top.

The length of the slit may for example be between 1.5 and 3 or even between 3 and 10 times the critical dimension. The length of the slit may for example be at least 3 times, or even 10 times, or even 100 times, or even 5000 times longer than the width of the slit. The length of the metal filled slit is thereby measured from one outer end of the metal to the opposite outer end of the metal measured in the dimension which crosses the first and the second semiconductor layer.

The top of FIG. 6 shows how such slits 123 filled with metal can be used as contact between mono 112—and polysilicon 122. In this example the slits are defined perpendicular to the edges of the polysilicon. The bottom of FIG. 4 shows the details of some of the possibilities of such a slit 123. The well doping in FIG. 4 is of the first conductivity type (n-doped) and in the contact areas 125 the conductivity is enhanced by a source/drain implant of the first conductivity type which is also used to implant the polysilicon layer. A silicide 124 is formed simultaneously on the polysilicon 122 and the mono-silicon 125 after the diffusion of the implant. The figure shows that one slit filled with tungsten can connect mono- to polysilicon even when side wall passivation structures 118 or residues 134 are still present. This is possible because of the length of the slit.

In FIG. 6 the interconnect 129, between the mono- and poly-silicon is realized after structuring of the polysilicon 122 in a comb shape. Metal filled slits 123 are present orthogonal to the teeth of the comb and provide the contact between the polysilicon shield and the mono-silicon. Afterwards the interconnect and the polysilicon are covered with a passivation layer. This is preferably a stoichiometric passivation layer. FIG. 6 also shows a first HDP oxide 127*a* in which the metal filled slits are formed and a second HDP oxide 127*b* on top of the first HPD oxide and on top of the metal filled slits.

In embodiments of the present invention metal filled slits may be provided as low ohmic interconnection lines between the electronic components and the bondpads even without making a mono-polysilicon contact.

Figure 7:
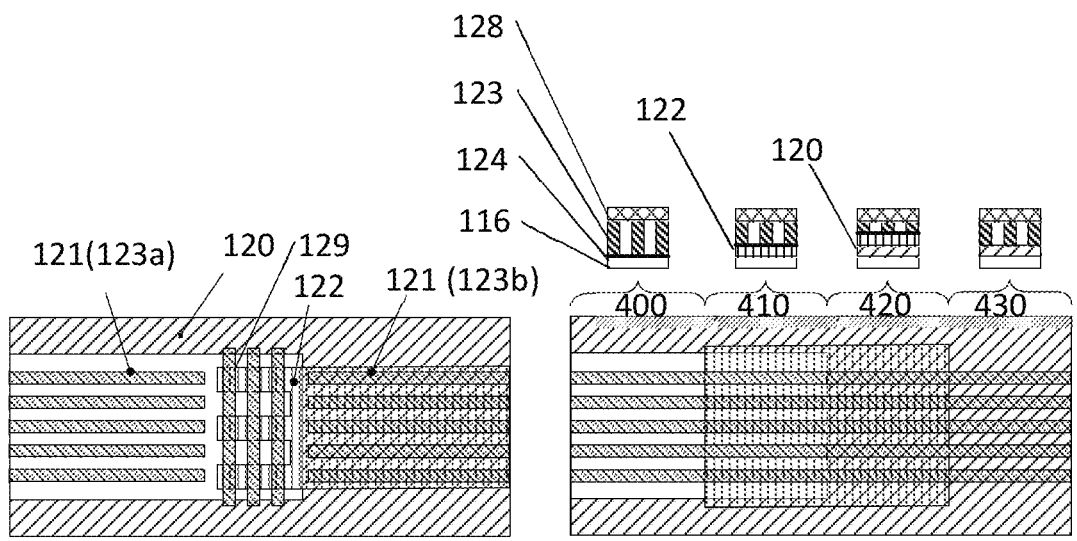
FIG. 7 shows metal filled slit interconnects as low ohmic interconnection lines, in accordance with embodiments of the present invention.

FIG. 7 shows metal (e.g. tungsten) filled slit interconnects 129 as low ohmic interconnection lines, in accordance with embodiments of the present invention. These interconnects 129 are shown in the middle of the left picture. On the left side of the left picture a conductive path comprising metal filled slits 123*a* is shown which is defined in a path where no field oxide is grown. The width of such a path can for example range from 1 to 40 μm and it can be as long as the length of the die or even more.

In embodiments of the present invention the surface of the mono-silicon is doped with a source/drain implant to obtain a highly doped path 116 and covered with a silicide 124. An array of metal filled slits 123*a* is placed on top of the silicide 124 and these slits are realized over the entire length of the path aligned in the direction of the current. These metal filled slits are part of the conductive path 121 between the at least one electronic component and at least one bondpad 130. The conductive path 121 is electrically isolated from the rest of the chip by the source/drain diffusion 116 of the silicon. Therefore, this diffusion must have a doping that is opposite of the doping of the silicon around this diffusion. For a n-type mono-silicon deep well 112 the source drain doping must be p-type. The voltage of the substrate must be kept at a voltage that keeps the pn junction between the conduction path 121 and the bulk 112 in reverse bias so that isolation is obtained. One can also consider defining a p-type well over the length of the path which will increase the breakdown voltage between this line and the substrate, but also increase the capacitance between this conduction line and the bulk. Another effect is that small leakage currents will be present between these conductive paths 121 and the bulk in the order of 10 to 100 pA at room temperature. Such currents will not essentially affect the behavior of a Wheatstone bridge with a resistance up to 100 KOhm. (note that such leakage currents are always present for piezoresistors or other electrical components that make use of the well implant of the $2^{nd}$ type)

A similar conductive path 121 is shown at the right of the left picture where the metal filled slits are placed on the polysilicon layer 122 on a field oxide 120. The conductive path comprises metal filled slits 123*b*. A disadvantage of this conduction path is that the slits are less deep than the slits on the mono-silicon and therefore the resistance of such lines will be higher. However, the isolation of this line towards the bulk 112 is provided by the field oxide 120 and not by a pn junction. Therefore, the leakage current of such a conduction line towards the bulk can be totally neglected. The breakdown voltage is not improved as at the end of such a line always a contact to an electronic component 115 is made and this electronic component 115 in the well 114 always has a break down voltage.

The right picture of FIG. 7 shows the four different options that one has by defining metal filled slits as conductive paths in accordance with embodiments of the present invention. The left part 400 shows the metal filled slits placed on mono-silicon 116. This will result in the lowest resistivity of the path but will also increase somewhat the leakage current to the bulk. The part 410 shows a similar conductive path with polysilicon 122 between the metal filled slits 123 and the mono-silicon 116 resulting in a low ohmic connection between the mono- 116 and polysilicon 122 at the left edge of the polysilicon 122. This line will have higher resistance than the array of metal filled slits on the mono-silicon 116, but it will show less leakage currents as a native oxide is present between the polysilicon 122 and the mono-silicon 116. The cross section 420 shows that the height of the metal filled slits 123 is minimal when polysilicon 122 is present between these slits and the field oxide 120. This will result in the least conductive path. The cross section 430 shows perfectly isolated conductive paths 121 on top of a field oxide 120. These paths will have less good conductivity than the paths in cross section 300 at the left, but without leakage currents and depletion capacitance. Therefore, this solution would be preferred for high temperature applications where leakage currents must be minimized.

The table below shows a comparison of resistances of conductive paths in accordance with embodiments of the present invention. The resistance of an array of polysilicon lines covered with a silicide with a width of 10 μm and a length of 1 mm will be about 150 ohm whereas a single line of tungsten with a length of 1 mm will result in a similar resistance of 132 ohm. However, an array of tungsten filled slits with a width of 10 μm and a length of 1 mm will be only 11 ohm, about 8 times less than a conventional platinum interconnect with a thickness of 0.2 μm and a width of 10 μm.

Figure 8A:
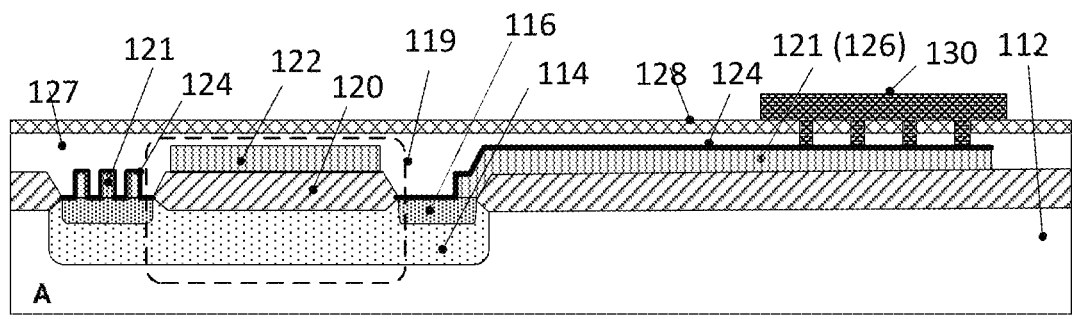
FIGS. 8a and 8b show a conductive path comprising a polysilicon structure on top of a field oxide in accordance with embodiments of the present invention.

| | | |
|---|---|---|
| R tungsten line (W: 0.4 μm, L: 10 μm) | 1.32 | Ohm |
| $R_{sheet}$ tungsten parallel lines a) | 0.11 | Ohm/sq |
| $R_{sheet}$ silicided polySi lines b) | 1.50 | Ohm/sq | a) 0.4 um wide, 1 um high tungsten lines at 0.8 um pitch
b) 0.4 um wide 0.4 um high poly lines at 0.8 um pitch FIG. 8a shows a conductive path 121 comprising a polysilicon structure 126 on top of a field oxide 120 in accordance with embodiments of the present invention. The polysilicon structure 126 is in contact with a p+ diffusion 116. A silicide 124 is covering the polysilicon structure 126 and the p+ diffusion 116. The polysilicon structure 126 is a p-doped polysilicon. Compared to the conductive path illustrated in FIG. 3 a lower leakage current and depletion capacitance can be obtained at the cost of an increased resistivity.

Figure 8B:
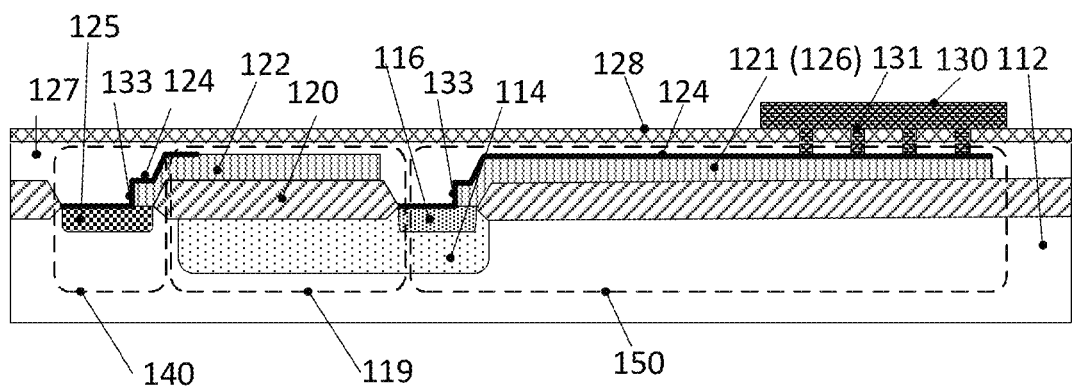

FIG. 8b shows the same configuration as FIG. 8a, but now with the connection 140 between the polysilicon shield 122 to a diffusion 125 of the $2^{nd}$ conductivity type in the bulk where 119 represents the sensing element and 150 the conductive path.

Figure 9A:
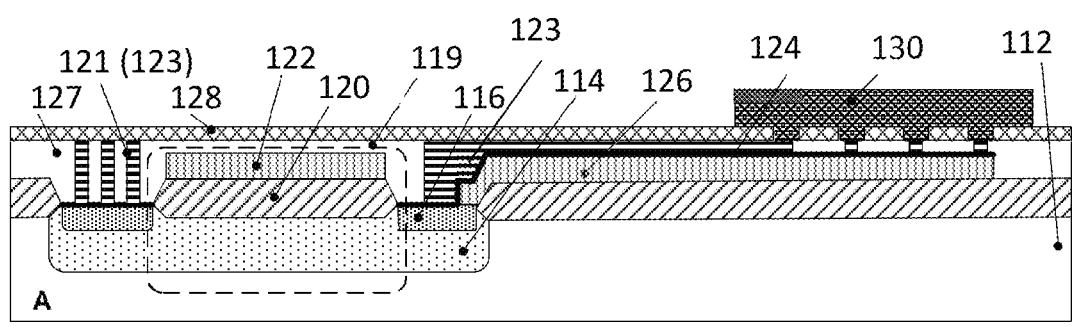
FIGS. 9a and 9b show a conductive path comprising tungsten filled slits on top of a field oxide in accordance with embodiments of the present invention.

FIG. 9a shows a conductive path comprising tungsten filled slits 123 on top of a field oxide 120 in accordance with embodiments of the present invention. The conductive path comprises a p-doped polysilicon structure 126 on top of the field oxide 120, a silicide 124 on top of the polysilicon structure and the tungsten filled slits 123 on top of the silicide. Compared to the conductive paths illustrated in FIG. 5 a lower leakage current and depletion capacitance can be obtained at the cost of an increased resistivity. It is, moreover, advantageous that the structure of FIG. 9a can be obtained using a more robust process.

Figure 9B:
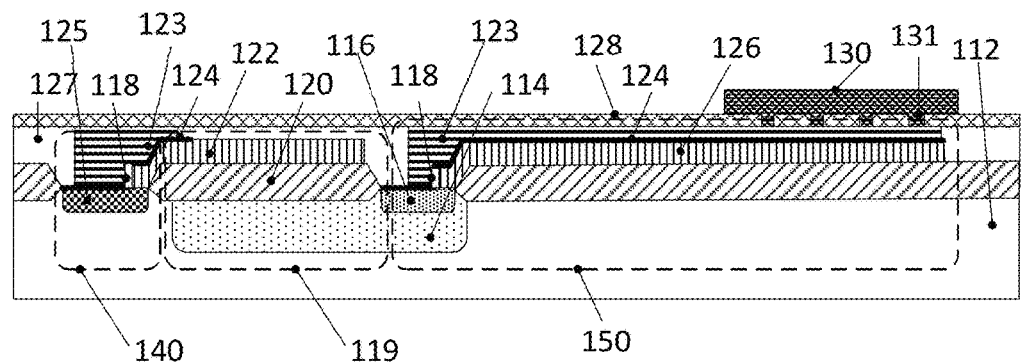

FIG. 9b shows the same configuration as FIG. 9a, but now with the connection 140 between the polysilicon shield 122 to a diffusion 125 of the $2^{nd}$ conductivity type in the bulk where 119 represents the sensing element and 150 the conductive path.

In the previous example the electronic component was a piezo resistor. The invention is, however, not limited thereto and can be applied for different other electronic components. The invention may for example also be applied in the field of IR sensors to connect p-type polysilicon to n-type polysilicon on a thin membrane to make thermocouples.

Figure 10:
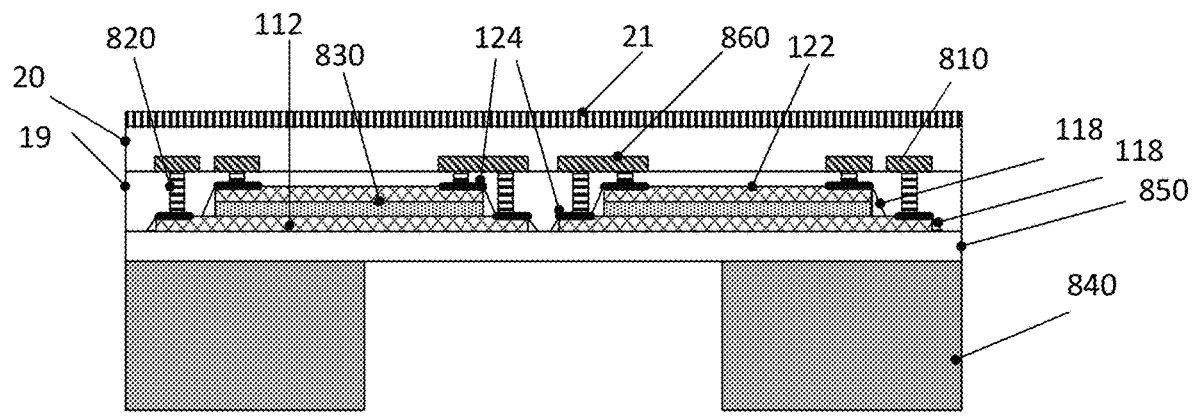
FIG. 10 shows a prior art thermocouple made for an IR sensor.

An example of such a prior art thermocouple device is illustrated in FIG. 10. It shows a silicon wafer 840 with an edged membrane. A field oxide 850 covers the silicon wafer. A first doped polysilicon layer 112 is covered with an oxide 830 grown on the first doped polysilicon layer 112 and a second doped polysilicon layer 122 is covering the first doped polysilicon layer 112. Metal contacts 810 are connected using wolfram plugs 820 with the first and second doped polysilicon layers. Aluminium bridges 860 between the metal contacts provide the contact between the first and second polysilicon layers. These aluminium bridges cause stress, reflections and thermal leaks.

Figure 11:
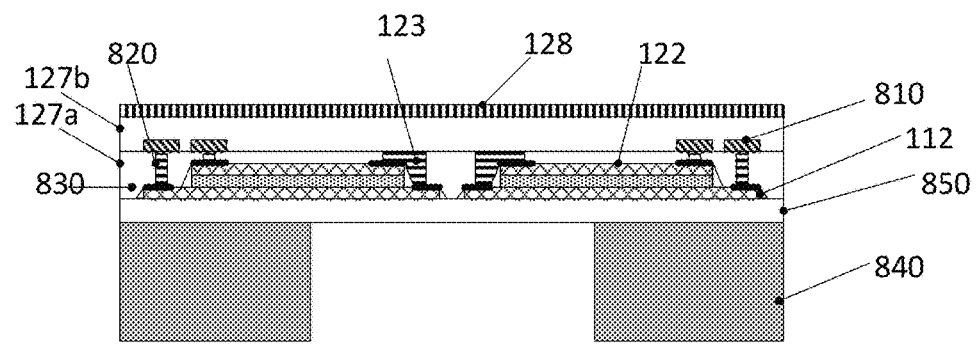
FIG. 11 shows a thermocouple for an IR sensor in accordance with embodiments of the present invention.

This is solved in the semiconductor device of FIG. 11 which shows a schematic drawing of a thermocouple device in accordance with embodiments of the present invention. In this example a first HPD oxide 127a is covering the first and second doped semiconductor layers (polysilicon). Silicide interconnects 124 are interconnecting the first and second doped semiconductor layers 112 and 122. In this example also metal filled slits 123 are interconnecting the first and second doped semiconductor layers 112 and 122 thereby increasing the conductivity. In this example a second HPD oxide 127b is covering the first HDP oxide. It is thereby an advantage of embodiments of the present invention that the absence of metal on the membrane prevents surface stress (cracks).

Figure 12:
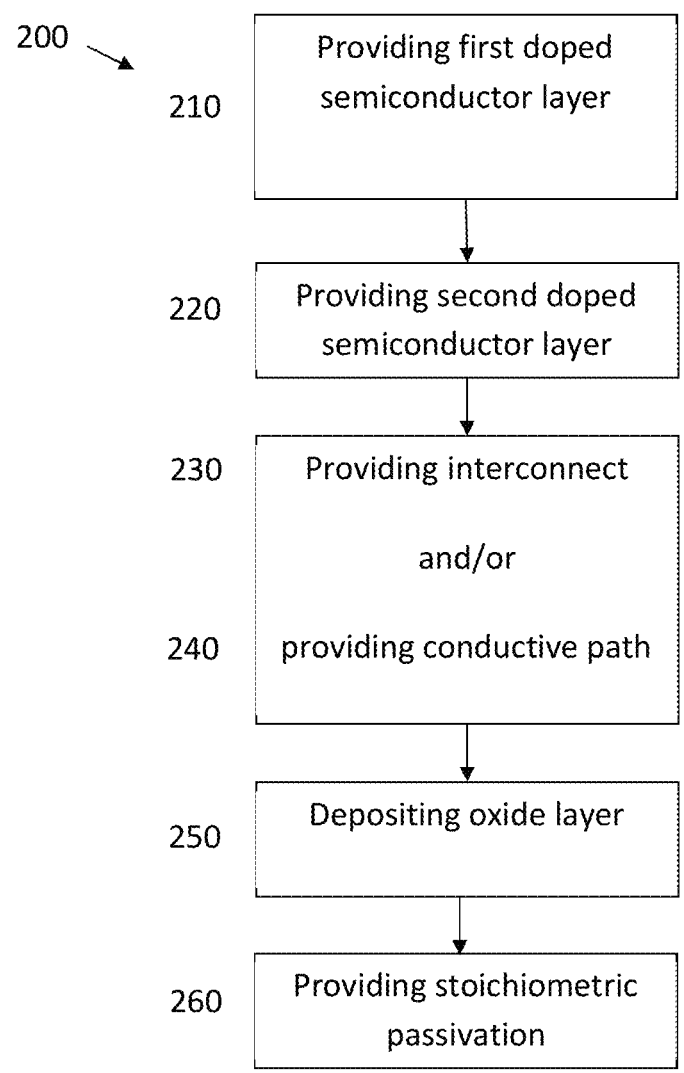

In a second aspect embodiments of the present invention relate to method 200 for manufacturing a semiconductor device. An example of such a method is illustrated in FIG. 12. An exemplary device obtained using such a method is illustrated in FIG. 3. The method comprises providing 210 a first doped semiconductor layer 112 and providing 220 a second doped semiconductor layer 122. At least one electronic component is formed in the first and/or second semiconductor layer.

In embodiments of the present invention the method may comprise providing 230 an interconnect, which comprises a metal alloy, which has a first part in contact with the first doped semiconductor layer and a second part in contact with the second doped semiconductor layer such that a part of the interconnect between the first part and the second part crosses over a sidewall (133) of the second doped semiconductor layer (122)

In embodiments of the present invention the method may comprise providing 240 a conductive path which comprises structured polycrystalline semiconductor material (e.g. structured polysilicon connections).

The method moreover comprises depositing 250 an oxide layer 127 over the second doped semiconductor layer 122 and over the first doped semiconductor layer 112.

The method moreover comprises providing 260 a stoichiometric passivation layer 128 over the first and second doped semiconductor layers 112, 122 and over the oxide layer 127.

In embodiments of the present invention providing the first semiconductor layer may comprise providing a substrate 110 which comprises a well 114 of a second conductivity type in a deep well 112 (the first doped semiconductor layer) of a first conductivity type opposite to the second conductivity type wherein at least one electronic component is provided in the well 114.

Providing the second semiconductor layer 122 may comprise applying 220 a polysilicon shield 122 over the electronic component 115. Providing the first semiconductor layer may comprise providing a mono-silicon layer.

In embodiments of the present invention this step may be followed by a step wherein source drain implants and a metal alloy (e.g. silicide) are formed simultaneously on the polysilicon and mono-silicon.

The oxide layer 127 may for example be a high-density plasma (HDP) chemical vapor deposited oxide.

It is an advantage of embodiments of the present invention that the steps can be applied using standard CMOS processing followed by some special post processing steps to accomplish reliability in harsh media.

In an exemplary embodiment of the present invention deep well diffusion of the first conductivity type may provide the electrical insulation of the electronic components, the diffusion of the second conductivity type may define the electronic components. The field oxide may isolate the polysilicon shields (first doped semiconductor layer) from the electronic components and source drain implants can be used to create substrate contacts and to connect the electronic components with each other. A standard silicide process may provide contact areas and areas with high conductivity.

In an exemplary embodiment A HDP oxide provides the first metal isolation.

In step 260 the passivation layer is provided. This is achieved by high temperature deposition 260 of a passivation layer to assure a stoichiometric structure with a minimum of dislocations and voids. This layer is indispensable to provide reliability in harsh media. In principle the LPCVD nitride deposition tool can be used that also defines the nitride used for masking the growing of the field oxide.

This step may be followed by non-CMOS steps of patterning the passivation layer to provide vias for the bondpads to the interconnect and the definition of bondpads covering these vias. Preferably these bondpads are made of a noble metal to resist harsh environments.

It is an advantage that no dedicated process control modules must be developed to monitor the quality of the mono-polysilicon contact during mass production.

FIG. 13 illustrates exemplary methods steps of a method for providing interconnections between the first and second doped semiconductor layer. The first box represents standard CMOS steps on wafer of the second conductivity type. A deep diffusion of the first conductivity type provides the electrical insulation of the electronic components 115, a diffusion of the second conductivity type defines the electronic components. The field oxide 120 isolates the polysilicon shields 122 (realized in the second doped semiconductor layer) from the electronic components 115 and source drain implants 116 are used to create substrate contacts and to connect the electronic components 115 with each other. An example of a device manufactured using this method is illustrated in FIG. 3.

In embodiments of the present invention silicide contacts are provided between the mono- and the polysilicon. This is achieved as indicated in the $2^{nd}$ box. The $2^{nd}$ box indicates that, in this example, the CMOS process needs to be modified in such a way that no sidewall protection is present before the silicide process is started. One could consider omitting the gate oxide processing to minimize the oxide thickness between the mono- and polysilicon.

The third box represents standard CMOS steps for forming a silicide 124 and HDP oxide. For the silicide process a silicide is created between the mono- and polysilicon at the edges of the polysilicon defined in areas without field oxide. The HDP oxide rounds the edges of the polysilicon and planarizes the surface. The use of chemical mechanical polishing (CMP) allows making perfectly flat surfaces but is not a necessary step.

The fourth box represents the high temperature deposition of the passivation layer 128 to assure a stoichiometric structure with a minimum of dislocations and voids. This layer is preferable to provide reliability in harsh media. In principle the LPCVD nitride deposition tool can be used that also defines the nitride used for masking the growing of the field oxide.

The last box represents the (non-CMOS) steps of patterning the passivation layer 128 to provide vias 131 for the bondpads 130 to the interconnect and the definition of bondpads 130 covering these vias 131. Preferably these bondpads 130 are made of a noble metal to resist harsh environments. An example of a stack implemented using this method is illustrated in FIG. 3.

The invention claimed is:

1. A semiconductor device comprising:
a first doped semiconductor layer, a second doped semiconductor layer, an oxide layer covering the first doped semiconductor layer and the second doped semiconductor layer, wherein the first doped semiconductor layer is a monosilicon layer and wherein the second doped semiconductor layer is a polysilicon layer, wherein at least one electronic component is formed in the first and/or second semiconductor layer, the semiconductor device, moreover, comprising at least one interconnect wherein the first doped semiconductor layer is electrically connected with the second doped semiconductor layer by means of the at least one interconnect wherein the at least one interconnect comprises a metal alloy which has a first part in contact with the first doped semiconductor layer and a second part in contact with the second doped semiconductor layer and wherein a part of the metal alloy between the first part and the second part crosses over a sidewall of the second doped semiconductor layer, and wherein the semiconductor device, moreover, comprises a stoichiometric passivation layer which covers the first and second doped semiconductor layer and the oxide layer.

2. The semiconductor device according to claim 1, comprising a conductive path which comprises polycrystalline semiconductor material.

3. The semiconductor device according to claim 2, wherein the conductive path is connected between the at least one electronic component and at least one via which is connected through the passivation layer with a bondpad.

4. The semiconductor device according to claim 3, wherein the conductive path comprises a patterned polysilicon layer between the electronic component and the at least one via.

5. The semiconductor device according claim 2, wherein the conductive path comprises structured polycrystalline semiconductor material covered with the metal alloy.

6. The semiconductor device according to claim 1, comprising:
   a well of a second conductivity type in a deep well of a first conductivity type or substrate of the first conductivity type opposite to the second conductivity type, wherein the deep well or substrate of the first conductivity type are realized in the first doped semiconductor layer,
   wherein the at least one electronic component is present in the well of the second conductivity type,
   wherein the second semiconductor layer is present between the passivation layer and the electronic component, and
   wherein the oxide layer is present over the second semiconductor layer, over the well of the second conductivity type and over the deep well or substrate of the first conductivity type.

7. The semiconductor device according claim 6, the semiconductor device comprising a conductive path wherein the conductive path comprises a highly doped path of the second conductivity type in the well of the second conductivity type.

8. The semiconductor device according to claim 1, the semiconductor device comprising a field oxide wherein the field oxide is present between the second doped semiconductor layer and the first doped semiconductor layer.

9. The semiconductor device according to claim 1, wherein the passivation layer comprises $Si_3N_4$ or diamond like carbon or diamond or SiC.

10. The semiconductor device according to claim 1, wherein the second doped semiconductor layer is at least partially covered with the metal alloy.

11. The semiconductor device according to claim 1, wherein the interconnect comprises a metal filled slit in contact with the metal alloy,
    wherein the metal filled slit is present in the oxide layer.

12. The semiconductor device according to claim 1, wherein the interconnect is electrically connected with the first doped semiconductor layer through a highly doped contact.

13. A method for manufacturing a semiconductor device, the method comprising:
    providing a first doped semiconductor layer,
    providing a second doped semiconductor layer,
    wherein the first and second doped semiconductor layer are provided such that at least one electronic component is formed in the first and/or second semiconductor layer, and wherein the first doped semiconductor layer is a monosilicon layer and wherein the second doped semiconductor layer is a polysilicon layer,
    wherein the method comprises providing an interconnect which comprises a metal alloy which has a first part in contact with the first doped semiconductor layer and a second part in contact with the second doped semiconductor layer such that a part of the interconnect between the first part and the second part crosses over a sidewall of the second doped semiconductor layer,
    depositing an oxide layer over the second doped semiconductor layer and over the first doped semiconductor layer, and
    wherein the method comprises providing a stoichiometric passivation layer over the first and second doped semiconductor layer and over the oxide layer.

14. The method according to claim 13, the method comprising providing at least one conductive path which comprises structured polycrystalline semiconductor material.

15. The method according to claim 14, wherein the at least one conductive path is provided starting from the at least one electronic component, and
    wherein at least one via is provided through the passivation layer such that the at least one via is connected with the conductive path and with a bondpad on the at least one via.

* * * * *